US011515475B2

(12) United States Patent
Hsieh et al.

(10) Patent No.: US 11,515,475 B2
(45) Date of Patent: Nov. 29, 2022

(54) RESISTIVE RANDOM ACCESS MEMORY DEVICES

(71) Applicant: GLOBALFOUNDRIES Singapore Pte. Ltd., Singapore (SG)

(72) Inventors: Curtis Chun-I Hsieh, Singapore (SG); Wei-Hui Hsu, Singapore (SG); Wanbing Yi, Singapore (SG); Yi Jiang, Singapore (SG); Kai Kang, Singapore (SG); Juan Boon Tan, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 190 days.

(21) Appl. No.: 15/931,607

(22) Filed: May 14, 2020

(65) Prior Publication Data

US 2021/0359203 A1    Nov. 18, 2021

(51) Int. Cl.
*H01L 45/00* (2006.01)
*H01L 27/24* (2006.01)

(52) U.S. Cl.
CPC ........... *H01L 45/122* (2013.01); *H01L 27/24* (2013.01); *H01L 45/124* (2013.01); *H01L 45/1253* (2013.01); *H01L 45/145* (2013.01); *H01L 45/1675* (2013.01)

(58) Field of Classification Search
CPC   H01L 45/124; H01L 45/1246; G11C 2213/51
See application file for complete search history.

(56) References Cited

U.S. PATENT DOCUMENTS

| 8,623,697 | B2* | 1/2014 | Magistretti | ......... H01L 45/1675 438/102 |
|---|---|---|---|---|
| 10,439,134 | B2 | 10/2019 | Majhi et al. | |
| 2005/0263829 | A1* | 12/2005 | Song | ................... H01L 45/1666 257/528 |
| 2011/0065252 | A1* | 3/2011 | Nakamura | ............ H01L 45/144 257/E21.004 |
| 2015/0280115 | A1* | 10/2015 | Zheng | ..................... H01L 45/16 257/2 |

* cited by examiner

*Primary Examiner* — Amar Movva
(74) *Attorney, Agent, or Firm* — David Cain

(57) ABSTRACT

The present disclosure generally relates to memory devices and methods of forming the same. More particularly, the present disclosure relates to resistive random-access (Re-RAM) memory devices. The present disclosure provides a memory device including an opening in a dielectric structure, the opening having a sidewall, a first electrode on the sidewall of the opening, a spacer layer on the first electrode, a resistive layer on the first electrode and upon an upper surface of the spacer layer, and a second electrode on the resistive layer.

15 Claims, 9 Drawing Sheets

RESISTIVE RANDOM ACCESS MEMORY DEVICES

FIELD OF THE INVENTION

The disclosed subject matter relates generally to memory devices and methods of forming the same. More particularly, the present disclosure relates to resistive random-access (ReRAM) memory devices.

BACKGROUND

Semiconductor devices and integrated circuit (IC) chips have found numerous applications in the fields of physics, chemistry, biology, computing, and memory devices. An example of a memory device is a non-volatile (NV) memory device. NV memory devices are programmable and have been extensively used electronic products due to its ability to retain data for long periods. Exemplary categories for NV memory may include resistive random-access memory (ReRAM), erasable programmable read-only memory (EPROM), flash memory, ferroelectric random-access memory (FeRAM), and magnetoresistive random-access memory (MRAM).

Resistive memory devices can operate by changing (or switching) between two different states: a high-resistive state (HRS), which may be representative of an off or 0 state; and a low-resistive state (LRS), which may be representative of an on or 1 state. However, these devices may experience large variations in resistive switching characteristics and may cause large fluctuations of current flow within the device, which decreases the performance of the device and increases its power consumption.

Therefore, there is a need to provide memory devices that can overcome, or at least ameliorate, one or more of the disadvantages as described above.

SUMMARY

In an aspect of the present disclosure, there is provided a memory device including an opening in a dielectric structure, the opening having a sidewall, a first electrode on the sidewall of the opening, a spacer layer on the first electrode, a resistive layer on the first electrode and upon an upper surface of the spacer layer, and a second electrode on the resistive layer.

In another aspect of the present disclosure, there is provided a memory device including an opening in a dielectric structure, the opening having a sidewall, a first electrode on the sidewall of the opening, the first electrode having an upper surface and a sidewall with upper and lower portions, a capping layer on the upper surface of the first electrode, a spacer layer on the lower sidewall portion of the first electrode, a resistive layer on the upper sidewall portion of the first electrode and upon an upper surface of the spacer layer, and a second electrode on the resistive layer.

In yet another aspect of the present disclosure, there is provided a method of forming a memory device by forming an opening in a dielectric structure, the opening having a sidewall, forming a first electrode on the sidewall of the opening, forming a spacer layer on the first electrode, forming a resistive layer on the first electrode and upon an upper surface of the spacer layer, and forming a second electrode on the resistive layer.

BRIEF DESCRIPTION OF THE DRAWINGS

The present disclosure may be understood by reference to the following description taken in conjunction with the accompanying drawings.

For simplicity and clarity of illustration, the drawings illustrate the general manner of construction, and certain descriptions and details of well-known features and techniques may be omitted to avoid unnecessarily obscuring the discussion of the described embodiments of the present disclosure. Additionally, elements in the drawings are not necessarily drawn to scale. For example, the dimensions of some of the elements in the drawings may be exaggerated relative to other elements to help improve understanding of embodiments of the present disclosure. The same reference numerals in different drawings denote the same elements, while similar reference numerals may, but do not necessarily, denote similar elements.

DETAILED DESCRIPTION

Various illustrative embodiments of the present disclosure are described below. The embodiments disclosed herein are exemplary and not intended to be exhaustive or limiting to the present disclosure.

Figure 1:
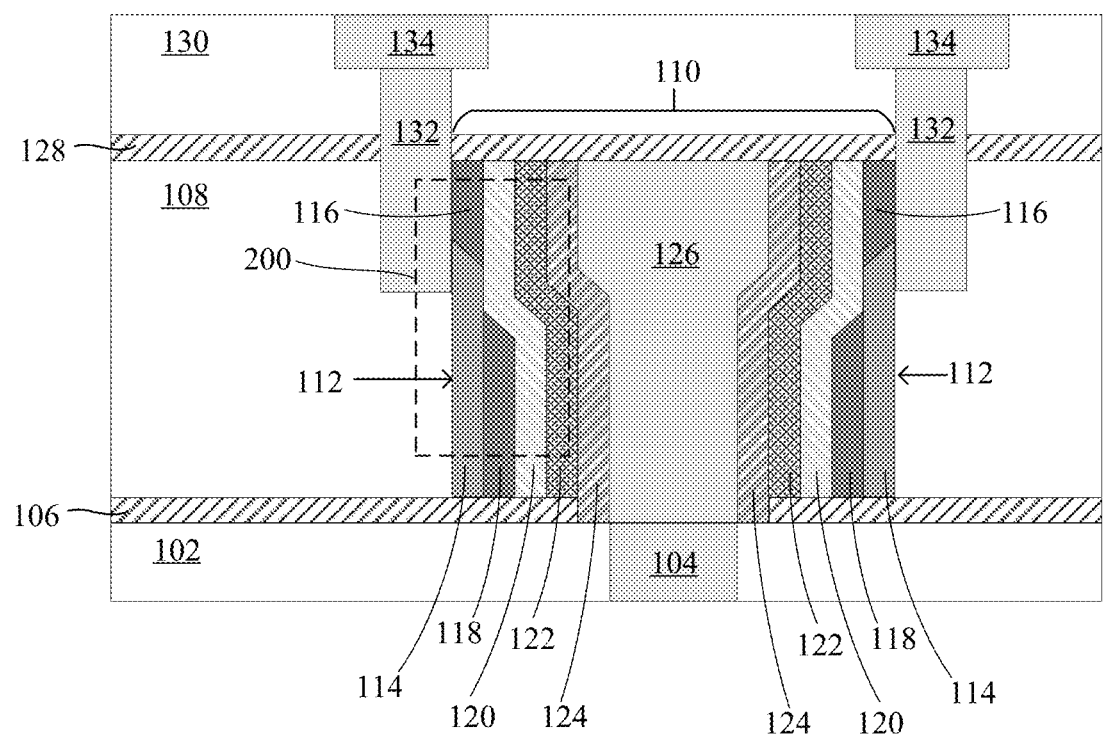
FIG. 1 is a cross-sectional view of an embodiment of a memory device, in accordance with the present disclosure.

FIG. 1 illustrates a cross-sectional view of an exemplary memory device in accordance with the present disclosure. The device includes an opening 110 arranged in a dielectric structure 108, a first electrode 114 on a sidewall 112 of the opening 110, a spacer layer 118 adjacent to the first electrode 114, a resistive layer 120 adjacent to the spacer layer 118, and a second electrode 122 adjacent to the resistive layer 120. In some embodiments, a capping layer 116 may be arranged on the sidewall 112 of the opening 110 and upon an upper surface of the first electrode 114.

The dielectric structure 108 may function as an interlayer dielectric (ILD) layer. The device may include multiple ILD layers, such as ILD layers 102, 108, 130, in a vertical stack configuration depending on design requirements. Exemplary materials for the ILD layers may include, but not limited to, silicon dioxide, or tetraethyl ortho silicate (TEOS) or a material having a chemical composition of $SiC_xO_yH_z$, wherein x, y, and z are in stoichiometric ratio. Dielectric barrier films 106, 128 may be arranged between the respective ILD layers 102, 108, 130 and may function as a diffusion barrier and an etch stop material. The dielectric barrier films 106, 128 may include silicon nitride, or Nitrogen doped silicon carbide, $SiC_xH_z$ (i.e., BLoK™) or $SiN_wC_xH_z$ (i.e., NBLoK™), wherein each of w, x, y, and z independently has a value greater than 0 and less than 0.75.

Interconnect features (e.g., interconnect vias 132 and conductive lines 104, 134) may be formed within the ILD layers 102, 108, 130 to provide electrical interconnections to other active components in the device. For example, as shown in FIG. 1, the first electrode 114 may be electrically coupled to the interconnect via 132. The interconnect via 132 may be laterally adjacent to the sidewall 112 of the opening 110. The interconnect via 132 may be arranged in the ILD layer 108 and extends into the ILD layer 130 to join conductive lines 134.

Example of active components in the device connected by the interconnect features may include diodes (e.g., single-photon avalanche diode) or transistors such as, but not limited to, planar field-effect transistor, fin-shaped field-effect transistors (FinFETs), ferroelectric field-effect transistors (FeFETs), complementary metal-oxide semiconductor (CMOS) transistors, and bi-polar junction transistors (BJT).

The second electrode 122 may be electrically coupled to a contact structure 126 arranged in the opening 110. The contact structure 126 may be arranged upon a conductive line 104 within the ILD layer 102. The contact structure 126, interconnect vias 132 and conductive lines 104, 134 may include a metal such as copper, cobalt, aluminum or an alloy thereof. A conductive barrier layer 124 may be arranged between the second electrode 122 and the contact structure 126. The conductive barrier layer 124 may function to prevent diffusion of atoms between the second electrode 122 and the contact structure 126, whilst allowing electrical conduction between the second electrode 122 and the contact structure 126. Examples of materials for the conductive barrier layer 124 may include, but not limited to, titanium nitride (TiN), or tantalum nitride (TaN).

Figure 2:
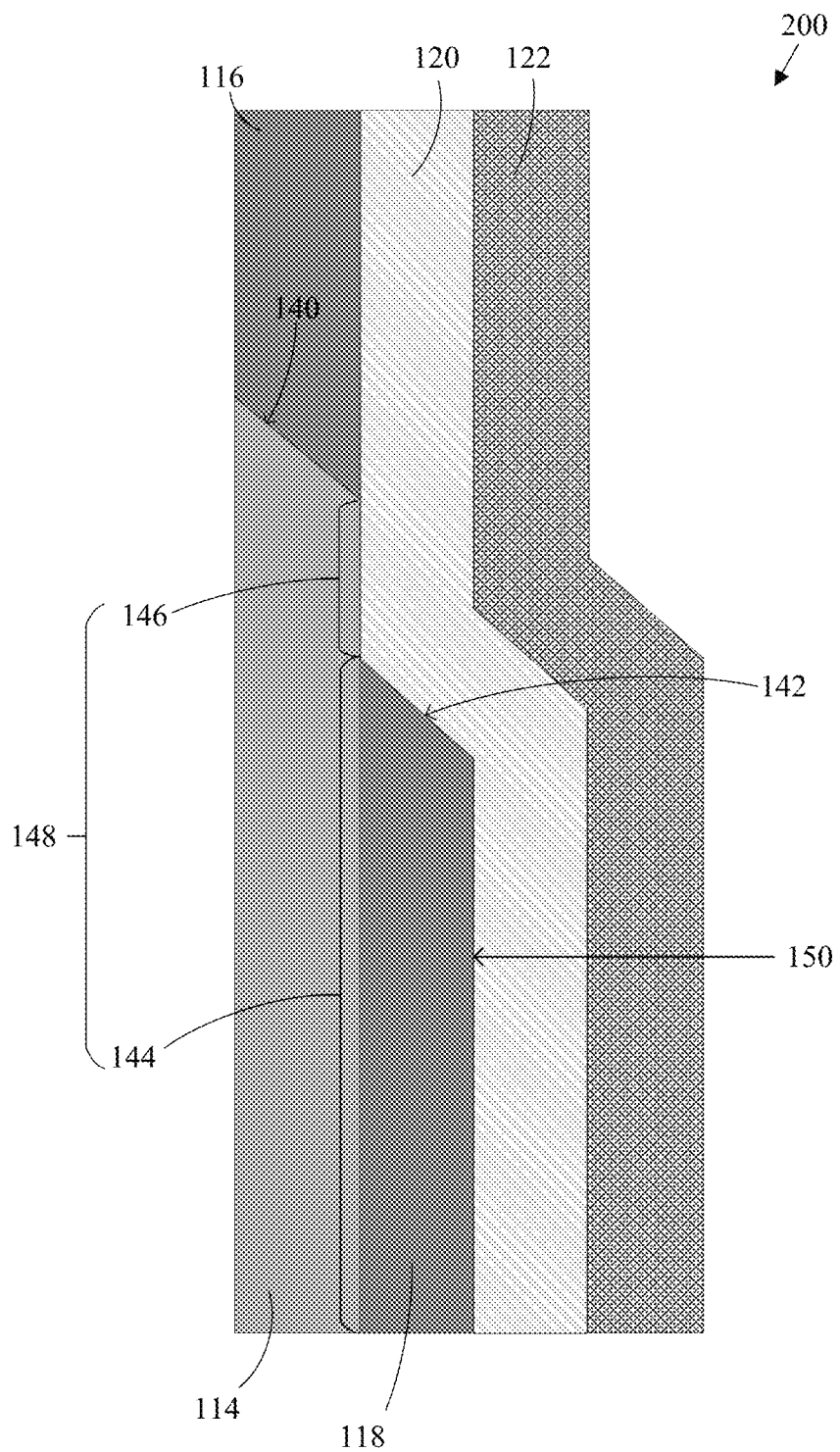
FIG. 2 is an enlarged cross-sectional view of the region surrounded by a broken-line rectangle shown in FIG. 1, in accordance with the present disclosure.

FIG. 2 is an enlarged view of the region 200 surrounded by a broken-line rectangle shown in FIG. 1, and illustrates the arrangement of the capping layer 116, the first electrode 114, the spacer layer 118, the resistive layer 120, and the second electrode 122.

As shown in FIG. 2, the first electrode 114 has an upper surface 140 and a sidewall 148 with an upper portion 146 and a lower portion 144. As described above, a capping layer 116 may be arranged upon the upper surface 140 of the first electrode 114 and may prevent the upper surface 140 of the first electrode 114 from being damaged during fabrication of the device.

The spacer layer 118 is arranged on the lower portion 144 of the sidewall 148 of the first electrode 114. The spacer layer 118 has an upper surface 142 and a lateral surface 150. The upper surface 142 of the spacer layer 118 is at a level below the upper surface 140 of the first electrode 114. The upper surface 142 of the spacer layer 118 and the upper surface 140 of the first electrode 114 may have tapered profiles (e.g., a planar, a convex, or a concave profile). As shown in FIG. 2, the upper surface 142 of the spacer layer 118 and the upper surface 140 of the first electrode 114 may be oblique or inclined with respect to a vertical axis.

The resistive layer 120 is arranged on the upper portion 146 of the sidewall 148 of the first electrode 114 and is also arranged upon the upper surface 142 of the spacer layer 118. In some embodiments, the resistive layer 120 may conform to the tapered upper surface profile of the spacer layer 118. The resistive layer 120 may extend to cover a lateral surface 150 of the spacer layer 118, in which the spacer layer 118 separates the lower portion 144 of the sidewall 148 of the first electrode 114 from the resistive layer 120.

The second electrode 122 is arranged on the resistive layer 120. The resistive layer 120 may be configured to have a switchable resistance in response to a change in voltage between the first electrode 114 and the second electrode 122. The resistive layer 120 may exhibit resistive changing properties characterized by different resistive states of the material forming this layer. These resistive states (e.g., a high resistive state or a low resistive state) may be used to represent one or more bits of information. During operational switching used to change the stored data, the resistive layer may change its resistive state when a certain switching voltage (e.g., a set voltage or a reset voltage) is applied to the resistive layer 120 and generates a conductive path, such as a switching current, through the resistive layer 120. The switching current may be in the form of a filament that electrically links the first electrode 114 with the second electrode 122.

Advantageously, the provision of the spacer layer 118 on the first electrode 114 is found to reduce the surface area contact between the first electrode 114 and the resistive layer 120. For example, by arranging the spacer layer 118 on the lower sidewall portion 144 of the first electrode 114, the generated switching current (i.e., the filament) can be confined within the section of the resistive layer 120 that is arranged on the upper sidewall portion 146 of the first electrode 114. The reduced surface area contact between the first electrode 114 and the resistive layer 120 may reduce variations in the resistive switching characteristics (i.e., a stable switching of resistive states) during operation of the device and reduce its power consumption. Additionally, the presence of the spacer layer 118 on the lower sidewall portion 144 of the first electrode 114 may also prevent the formation of a filament in the resistive layer 120 at the lower sidewall portion 144 of the first electrode 114.

More advantageously, the section of the resistive layer 120 arranged upon the upper surface 142 of the spacer layer 118 may form a bend with the section of the resistive layer 120 arranged on the upper portion 146 of the sidewall 148 of the first electrode 114, which can provide additional confinement of the filament in the resistive layer 120 and a reduced surface area contact between the first electrode 114 and the resistive layer 120. Furthermore, the arrangement of the capping layer 116 upon the upper surface 140 of the first electrode 114 may offer the advantage of providing a shorter first electrode 114 so as to reduce its surface area contact with the resistive layer 120, and also prevent the formation of a filament near the upper surface of the dielectric structure 108.

Examples of the material for the resistive layer 120 may include carbon polymers, perovskites, metal oxides or nitrides. Some examples of metal oxides may include lanthanide oxides, tungsten oxide, zinc oxide, nickel oxide, niobium oxide, titanium oxide, hafnium oxide, aluminum oxide, tantalum oxide, zirconium oxide, yttrium oxide, scandium oxide, magnesium oxide, chromium oxide, and vanadium oxide. Examples of nitrides may include boron nitride and aluminum nitride. In some embodiments, metal oxides with a bandgap greater than 3 eV may be used. Examples of such oxides may include titanium oxide, tungsten oxide, niobium oxide, nickel oxide, zinc oxide, lanthanide oxides, hafnium oxide, aluminum oxide, tantalum oxide, zirconium oxide, and yttrium oxide.

The first electrode 114 and the second electrode 122 may include a conductive material such as, but not limited to, titanium, titanium nitride, tantalum, tantalum nitride, and platinum. The spacer layer 118 and the capping layer 116 may include a dielectric material such as silicon dioxide, silicon nitride, or silicon oxynitride.

The memory device described herein may be a resistive memory device. Examples of the resistive memory device may include, but not limited to, oxide random-access memory (OxRAM) and conductive bridge random-access memory (CBRAM).

Figure 3:
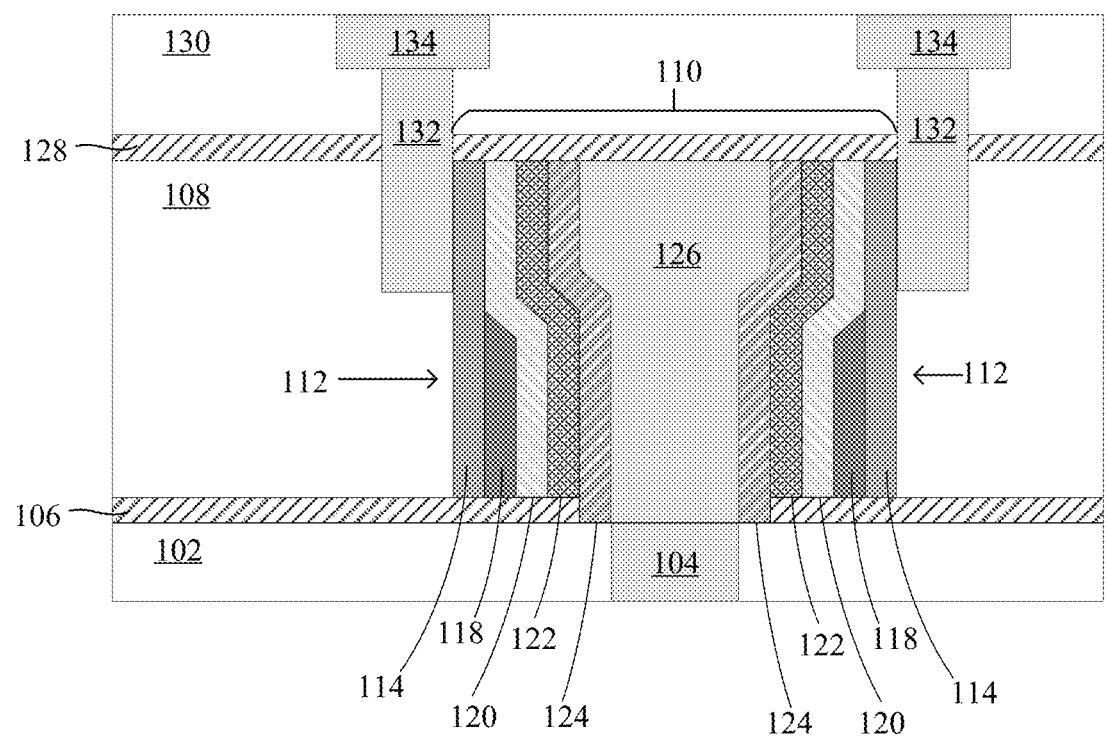
FIG. 3 is a cross-sectional view of another embodiment of a memory device, in accordance with the present disclosure.

FIG. 3 illustrates another embodiment of a memory device in accordance with the present disclosure. The embodiment shown in FIG. 3 is similar to the embodiment shown in FIG. 1 except that in FIG. 3, the capping layer 116 is absent. As shown, the upper surface of the first electrode 114 may be co-planar with the upper surface of the dielectric structure 108.

Figure 4:
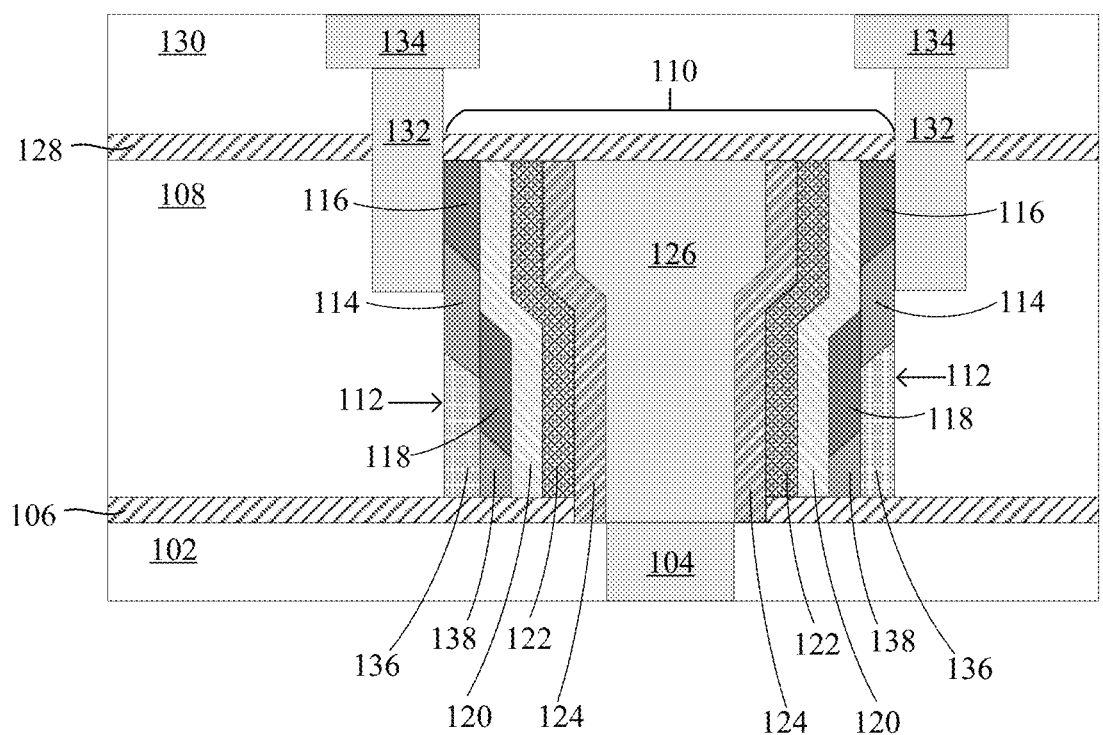
FIG. 4 is a cross-sectional view of yet another embodiment of a memory device, in accordance with the present disclosure.

FIG. 4 illustrates yet another embodiment of a memory device in accordance with the present disclosure. The embodiment shown in FIG. 4 is similar to the embodiment shown in FIG. 1 except that in FIG. 4, an oxide layer 136 may be present and arranged below the first electrode 114. As shown, the oxide layer 136 may be arranged on the sidewall 112 of the opening 110, in which the first electrode 114 is arranged upon an upper surface of the oxide layer 136. Additionally, a floating electrode 138 may be formed below the spacer layer 118 and being laterally adjacent to the oxide layer 136. The presence of the oxide layer 136 may offer the advantage of a shorter first electrode 114 as compared to the embodiment in FIG. 1. A shorter first electrode 114 may reduce its surface area contact with the resistive layer 120.

FIGS. 5 through 12 show a set of steps that may be used to create the memory devices as provided for in embodiments of the present disclosure.

As used herein, "deposition techniques" refer to the process of applying a material over another material (or the substrate). Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), atomic layer deposition (ALD).

Additionally, "patterning techniques" includes deposition of material or photoresist, patterning, exposure, development, etching, cleaning, and/or removal of the material or photoresist as required in forming a described pattern, structure or opening. Examples of techniques for patterning include, but not limited to, wet etch lithographic processes, dry etch lithographic processes or direct patterning processes. Such techniques may use mask sets and mask layers.

Figure 5:
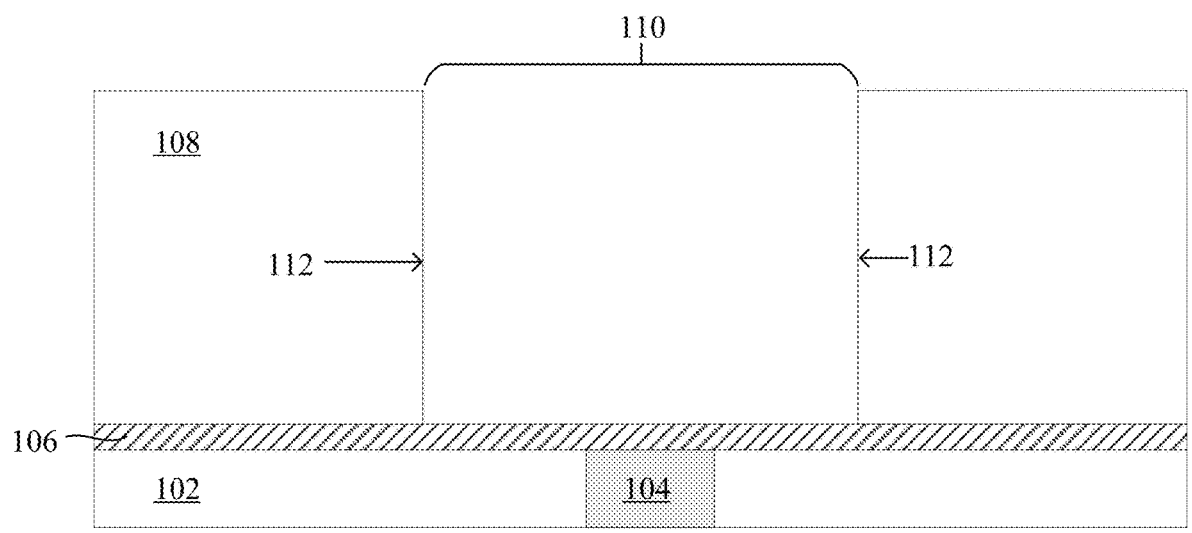
FIGS. 5 to 12 are cross-sectional views depicting various stages of forming a memory device, in accordance with embodiments of the present disclosure.

Referring to FIG. 5, there is provided a dielectric structure 108 is arranged above an ILD layer 102. The ILD layer 102 may include a conductive line 104. A dielectric barrier film 106 may be arranged upon the ILD layer 102 and the dielectric structure 108 is arranged upon the dielectric barrier film 106. As described herein, the dielectric structure 108 may be an ILD layer. An opening 110 with sidewalls 112 may be formed in the dielectric structure 108 using patterning techniques.

Figure 6:
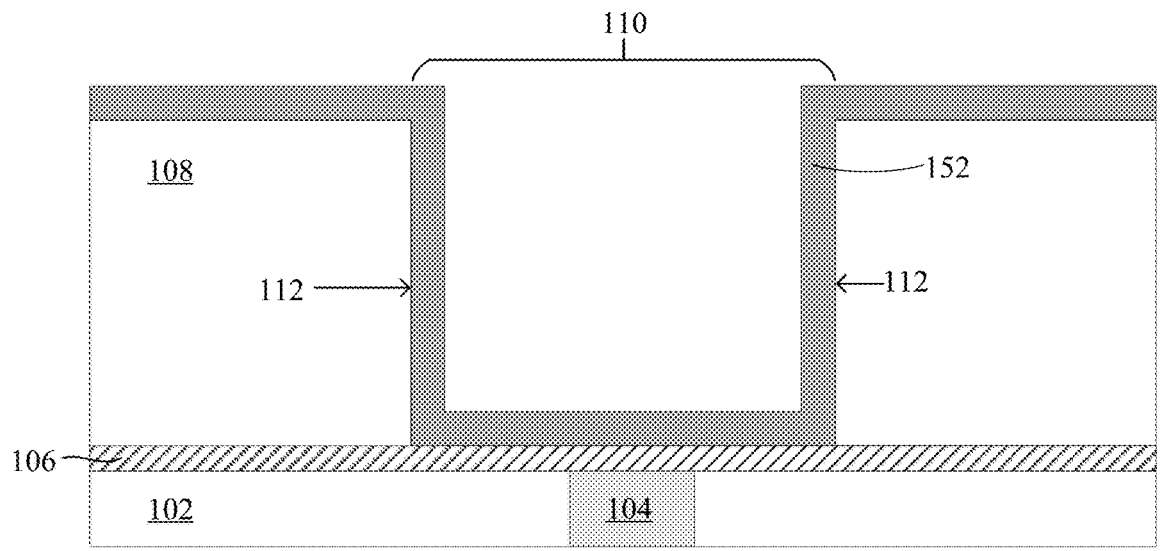

FIG. 6 illustrates the formation of a first electrode layer 152. The electrode layer 152 may be formed using various deposition techniques. However, it may be preferable to employ a conformal deposition such as an ALD process or a highly-conformal CVD process for depositing the first electrode layer 152. As shown, the first electrode layer 152 conforms to the sidewalls 112 of the opening 110.

Figure 7:
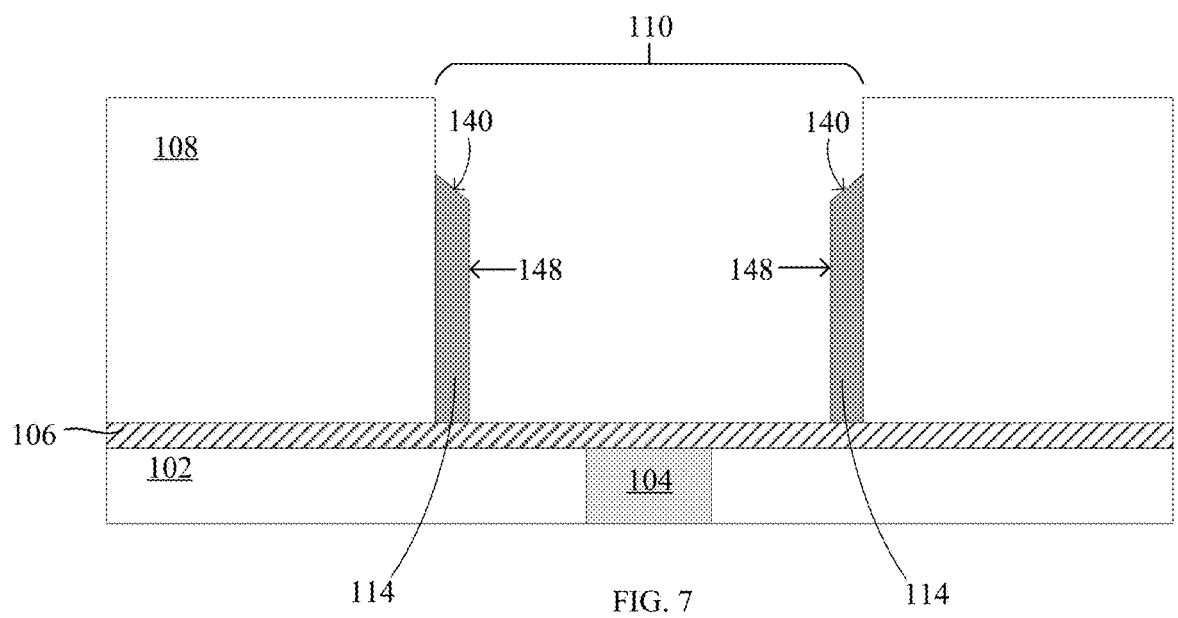

FIG. 7 illustrates the formation of a first electrode 114 on the sidewalls 112 of the opening 110. The first electrode layer 152 may be etched to form the first electrode 114 using patterning techniques such that an upper surface 140 of the first electrode 114 is recessed within the opening 110. The upper surface 140 of the first electrode 114 may have a tapered profile after the etching. Depending on the type of etch used (e.g., isotropic or anisotropic), the tapered upper surface profile may be convex, concave, or planar.

Figure 8:
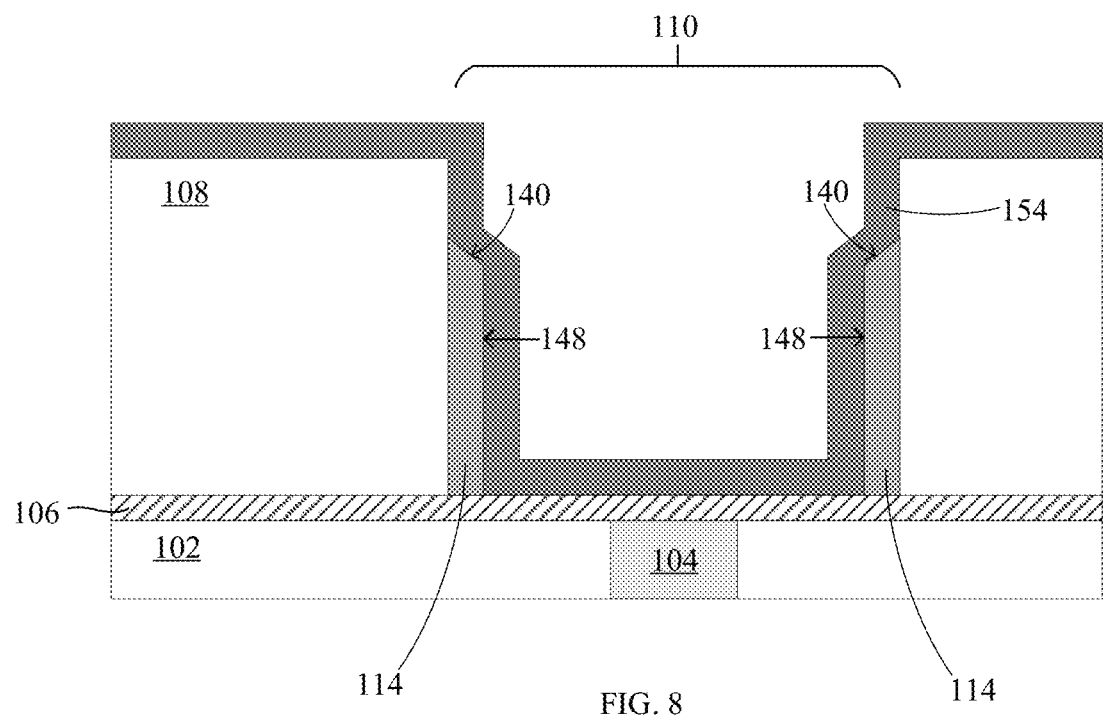

FIG. 8 illustrates the formation of a dielectric material layer 154 on the sidewalls 112 of the opening 110 and the first electrode 114. In particular, the dielectric material layer 154 is deposited to conform to the sidewalls 112 of the opening 110 and the upper surface 140 and a sidewall 148 of the first electrode 114. A conformal deposition process may be preferred for depositing the dielectric material layer 154; for example, ALD process or highly-controlled CVD process.

Figure 9:
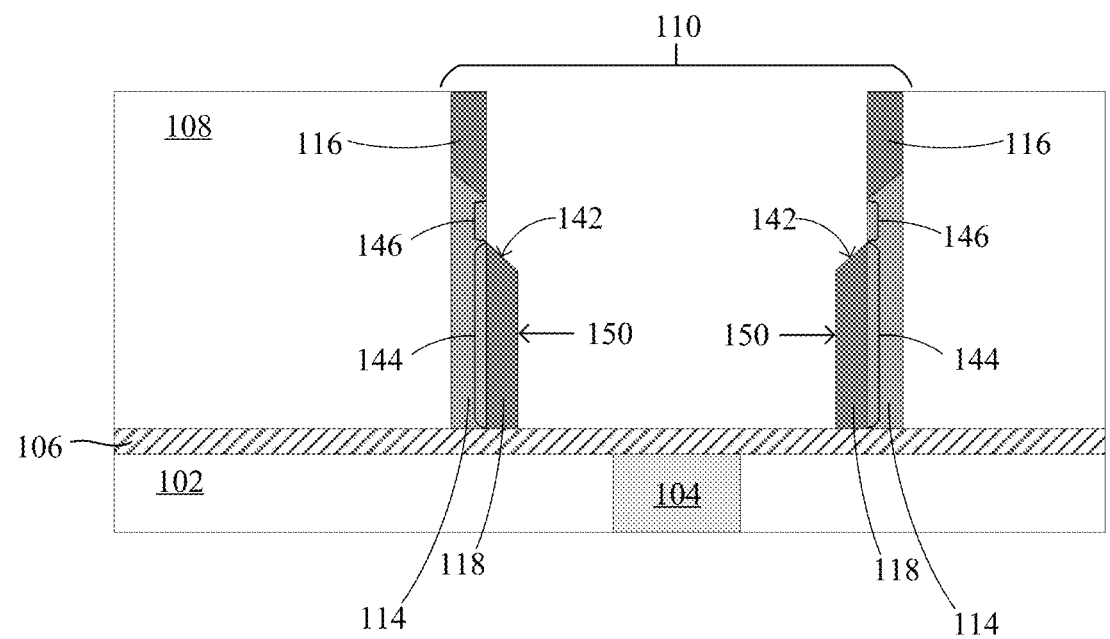

FIG. 9 illustrates the formation of a spacer layer 118 and a capping layer 116. The spacer layer 118 and the capping layer 116 may be formed simultaneously by etching the deposited dielectric material layer 154. As shown, the etching severs the dielectric material layer 154 and exposes an upper sidewall portion 146 of the first electrode 114. Accordingly, the spacer layer 118 is retained on a lower sidewall portion 144 of the first electrode 114. Additionally, the capping layer 116 is retained upon the upper surface of the first electrode 114 after the etching process.

The spacer layer 118 has an upper surface 142 and a lateral surface 150. The upper surface 142 of the spacer layer 118 may be etched to a level below the upper surface 140 of the first electrode 114. The upper surface 142 of the spacer layer 118 may have a tapered profile after the etching. Depending on the type of etch used (e.g., isotropic or anisotropic), the tapered upper surface profile may be convex, concave, or planar.

Figure 10:
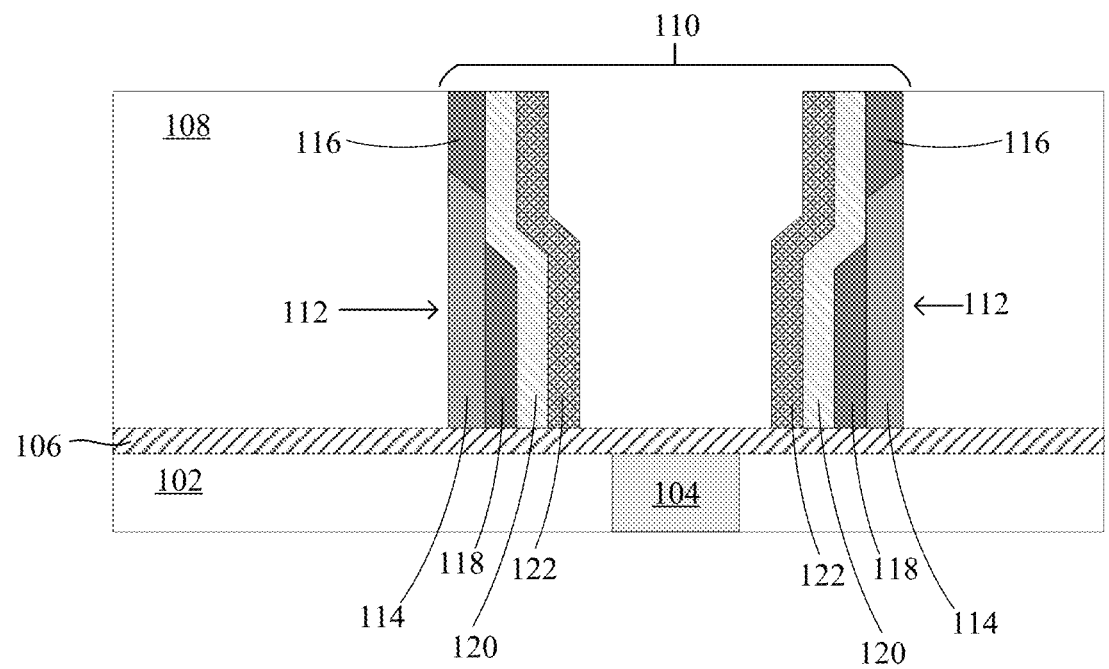

FIG. 10 illustrates the formation of a resistive layer 120 and a second electrode 122 in the opening 110. The resistive layer 120 may be deposited using a conformal deposition process, such as an ALD process or a highly-controlled CVD process. As shown, the resistive layer 120 is deposited on the capping layer 116, the upper portion of the sidewall of the first electrode 114, the upper surface of the spacer layer 118, and extending to cover the lateral surface 150 of the spacer layer 118.

Due to the conformal deposition of the resistive layer, the section of the resistive layer 120 that is deposited on the upper surface of the spacer layer 118 may form a bend having an angle between 90 to 180 degrees with the section of the resistive layer 120 that is deposited on the upper portion of the sidewall of the first electrode 114. Subsequently, the second electrode 122 may be formed on the resistive layer 120 using deposition techniques.

Figure 11:
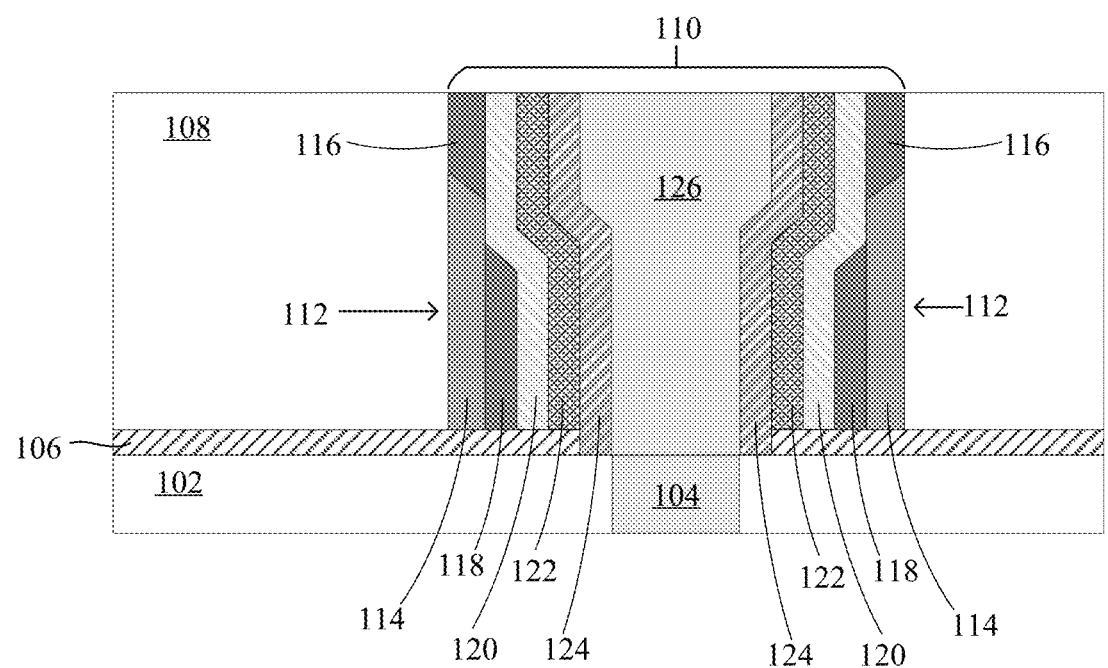

FIG. 11 illustrates the formation of a contact structure 126 in the opening 110. The portion of the dielectric barrier film 106 directly above the conductive line 104 may be removed and a conductive barrier layer 124 may be formed on the second electrode 122 using deposition techniques. Subsequently, the contact structure 126 may be formed on the conductive line 104 using deposition techniques. A chemical mechanical planarization (CMP) process may be performed to planarize the upper surface of the contact structure 126. During the CMP process, an upper portion of the capping layer 116 may be sacrificed and removed, which prevents unwanted damage to the first electrode 114.

Figure 12:
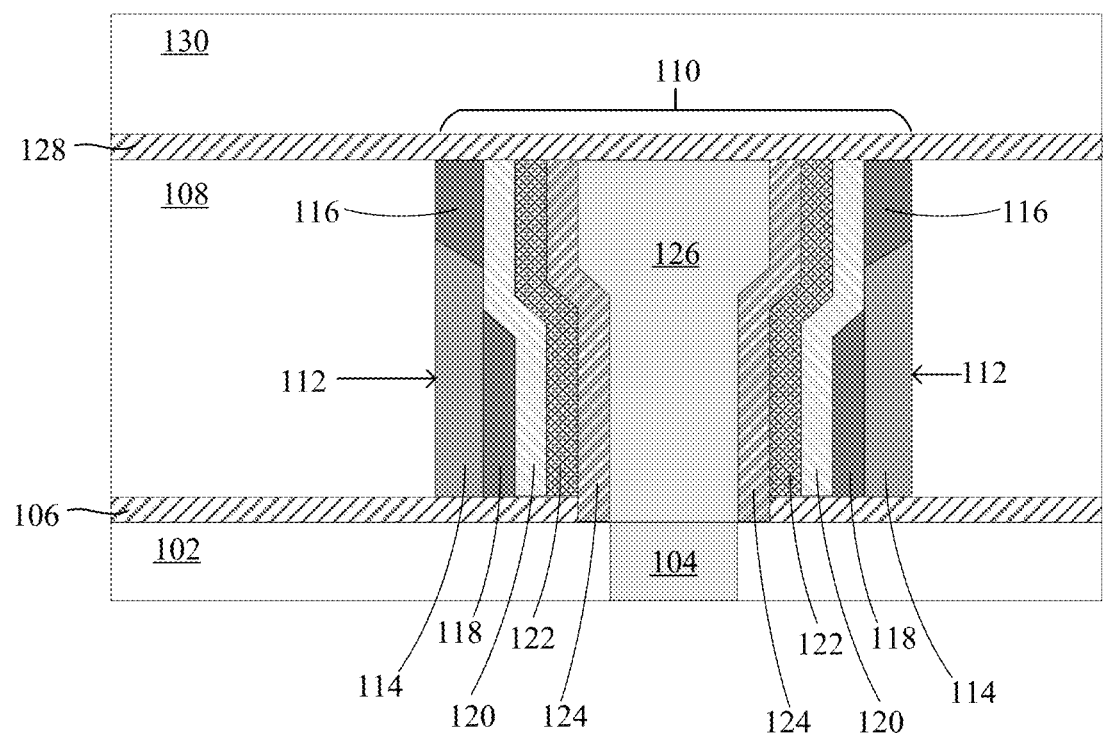

FIG. 12 illustrates the formation of an ILD layer 130 above the dielectric structure 108. A dielectric barrier film 128 may be deposited using deposition techniques on the dielectric structure 108 and covers the opening 110. The ILD layer 130 may be deposited on the dielectric barrier film 128. To form the embodiment shown in FIG. 1, the ILD layer 130 may be patterned using patterning techniques to form openings (not shown) for the formation of interconnect features, such as interconnect vias 132 and conductive lines 134. The interconnect features may be formed by the deposition of a metal to fill the openings.

Throughout this disclosure, it is to be understood that if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of elements is not necessarily limited to those elements, but may include other elements not expressly listed or inherent to such process, method, article, or device. Occurrences of the phrase "in an embodiment" herein do not necessarily all refer to the same embodiment.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein. Furthermore, there is no intention to be bound by any theory presented in the preceding background or the following detailed description.

Additionally, the various tasks and processes described herein may be incorporated into a more comprehensive procedure or process having additional functionality not described in detail herein. In particular, various processes in the manufacture of integrated circuits are well-known and so, in the interest of brevity, many processes are only mentioned briefly herein or omitted entirely without providing the well-known process details.

As will be readily apparent to those skilled in the art upon a complete reading of the present application, the disclosed semiconductor devices and methods of forming the same may be employed in manufacturing a variety of different integrated circuit products, including, but not limited to, memory cells, NV memory devices, FinFET transistor devices, CMOS devices, etc.

What is claimed is:

1. A memory device comprising:
   an opening in a first interlayer dielectric (ILD) layer, the opening having a sidewall;
   a first electrode on the sidewall of the opening in the first ILD layer, the first electrode has a sidewall with upper and lower portions;
   a spacer layer in the opening in the first ILD layer, the spacer layer is adjacent to and directly on the lower sidewall portion of the first electrode;
   a resistive layer in the opening in the first ILD layer, the resistive layer is adjacent to and directly on the upper sidewall portion of the first electrode, the resistive layer is also adjacent to the spacer layer;
   a contact structure in the opening in the first ILD layer, wherein the contact structure is electrically coupled to the second electrode;
   a second electrode adjacent to the resistive layer; and
   a second ILD layer below the first ILD layer;
   a conductive line in the second ILD layer, wherein the contact structure is arranged upon the conductive line.

2. The device of claim 1, wherein the spacer layer has an upper surface and a lateral surface, and the resistive layer is on the upper surface of the spacer layer.

3. The device of claim 2, wherein the resistive layer extends to cover the lateral surface of the spacer layer.

4. The device of claim 3, wherein the spacer layer separates the lower sidewall portion of the first electrode from the resistive layer.

5. The device of claim 2, wherein the upper surface of the spacer layer has a tapered profile.

6. The device of claim 5, wherein the resistive layer conforms to the tapered upper surface profile of the spacer layer.

7. The device of claim 2, wherein the first electrode has an upper surface, and the upper surface of the spacer layer is at a level below the upper surface of the first electrode.

8. The device of claim 1, further comprising an oxide layer on the sidewall of the opening in the first ILD layer, wherein the first electrode is arranged upon an upper surface of the oxide layer.

9. The device of claim 1, further comprising:
   a third ILD layer above the first ILD layer;
   a conductive line in the third ILD layer; and
   an interconnect via laterally adjacent to the sidewall of the opening in the first ILD layer, the interconnect via is arranged in the first ILD layer and extends into the third ILD layer to join the conductive line in the third ILD layer.

10. The device of claim 9, further comprising a conductive barrier layer in the opening in the first ILD layer, the conductive barrier layer is between the contact structure and the second electrode.

11. A memory device comprising:
    an opening in a dielectric structure, the opening having a sidewall;
    a first electrode on the sidewall of the opening, the first electrode having an upper surface and a sidewall with upper and lower portions;
    a capping layer arranged on the sidewall of the opening and directly on the upper surface of the first electrode, the capping layer is laterally adjacent to the resistive layer;
    a spacer layer adjacent to and directly on the lower sidewall portion of the first electrode;
    a resistive layer adjacent to and directly on the upper sidewall portion of the first electrode, the resistive layer is also adjacent to the spacer layer; and
    a second electrode adjacent to the resistive layer.

12. The device of claim 11, further comprising a contact structure in the opening, wherein the contact structure is electrically coupled to the second electrode, and the contact structure is coplanar with the capping layer.

13. The device of claim 12, further comprising a conductive barrier layer between the contact structure and the second electrode.

14. The device of claim 11, further comprising an interconnect feature laterally adjacent to the sidewall of the opening, wherein the interconnect feature is electrically coupled to the first electrode.

15. The device of claim 11, wherein the resistive layer is also directly on the capping layer.

* * * * *